United States Patent [19]

Yamazaki

[11] Patent Number: 4,967,058
[45] Date of Patent: Oct. 30, 1990

[54] POWER HEATING MEMBER

[75] Inventor: Mitsuki Yamazaki, Yokohama, Japan

[73] Assignee: Kabushiki Kaisha Toshiba, Kawasaki, Japan

[21] Appl. No.: 337,052

[22] Filed: Apr. 12, 1989

[30] Foreign Application Priority Data

Apr. 13, 1988 [JP] Japan .................................. 63-88951
Apr. 28, 1988 [JP] Japan ................................ 63-104061

[51] Int. Cl.⁵ .............................................. H05B 3/12
[52] U.S. Cl. ..................................... 219/221; 219/553
[58] Field of Search ............... 219/553, 221, 227, 228, 219/229, 230, 233; 29/743

[56] References Cited

U.S. PATENT DOCUMENTS

| | | | |
|---|---|---|---|
| 3,576,969 | 5/1971 | Surty | 219/221 |
| 4,025,750 | 5/1977 | Keizer | 219/85.18 |
| 4,255,644 | 3/1981 | Delorme | 219/233 |
| 4,528,546 | 7/1985 | Paoli | 219/543 |
| 4,828,162 | 5/1989 | Donner | 29/743 |
| 4,855,559 | 8/1989 | Donner | 219/85.16 |

Primary Examiner—Roy N. Envall, Jr.
Attorney, Agent, or Firm—Foley & Lardner, Schwartz, Jeffery, Schwaab, Mack, Blumenthal & Evans

[57] ABSTRACT

A heating member for processing an object to be processed in contact therewith by heat generated upon power supply, comprising a conductive substrate, and an insulating layer formed at least at that portion of the conductive substrate which is brought into contact with the object to be processed. The insulating layer has a specific resistance 100 times or more that of the conductive substrate, or of at least $10^{-2}$ Ω.cm. The insulating layer prevents a shunt current flowing from the heating member to the object to be processed.

15 Claims, 4 Drawing Sheets

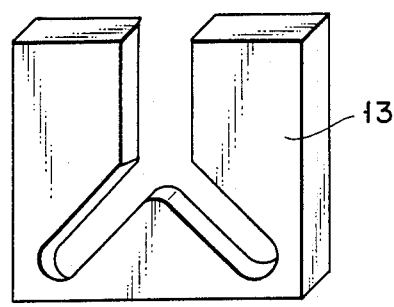
F I G. 1
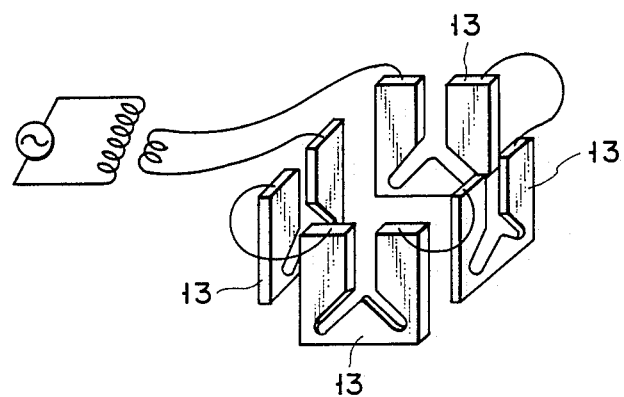
F I G. 2

POWER HEATING MEMBER

BACKGROUND OF THE INVENTION

1. Field of the Invention

The present invention relates to a power heating member for processing an object to be processed such as a lead wire by the Joule heat generated upon electric power supply.

2. Description of the Related Art

In recent years, factory automation has significantly progressed. For example, an apparatus for soldering a lead wire of an IC to a substrate is available. In this apparatus, a heating member consisting of a conductive material such as Fe, Mo, W, Ta, Cu, Al or stainless steel generates Joule heat upon power supply and urges a plurality of lead wires against a substrate at the same time, thereby soldering the lead wires to the substrate. Lead wires normally extend from an IC in two or four directions. Therefore, two or four heating members are arranged to oppose each other at two sides of an IC or to surround four sides of the IC. These heating members are electrically connected in series with each other. Although the heating members may be connected in parallel with each other, a current capacity required for the entire apparatus is increased in this case.

When the heating members consisting of a conductive material are directly brought into contact with lead wires of an IC to perform soldering, however, wiring of a substrate is brought into contact with the series-connected heating members, and the heating members are connected with each other via the wiring. In this case, a shunt current flows from the heating members to the wiring of the substrate. As a result, the wiring of the substrate is undesirably disconnected.

SUMMARY OF THE INVENTION

It is an object of the present invention to provide a power heating member for generating Joule heat upon power supply and processing an object in contact therewith such as a lead wire by the Joule heat, which can prevent a shunt current flowing from the heating member to the object to be processed.

It is another object of the present invention to provide a method of processing an object in contact therewith such as a lead wire by using Joule heat generated by a heating member upon power supply, which can process the object to be processed without causing a shunt current to flow from the heating member to the object to be processed.

According to the present invention, there is provided a heating member for processing an object to be processed in contact therewith by heat generated upon power supply, comprising a conductive substrate, and an insulating layer formed at least at that portion of the conductive substrate which is brought into contact with the object to be processed. The insulating layer has a specific resistance 100 times or more that of the conductive substrate.

The insulating layer formed on the conductive substrate may be an insulating region formed by modifying a surface region of the substrate or an insulating film formed on the surface of the substrate.

In addition, according to the present invention, there is provided a power heating member for processing an objected to be processed in contact therewith by heat generated upon power supply, comprising a conductive substrate, and an insulating layer formed at least at that portion of the conductive substrate which is brought into contact with the object to be processed. The insulating layer has a specific resistance of $10^{-2}$ $\Omega$.cm or more.

Also, according to the present invention, there is provided a method of processing an object to be processed comprising the steps of supplying power to a conductive substrate of a heating member comprising the conductive substrate, and a processing part consisting of an insulating layer formed at least at a portion of the conductive substrate and having a specific resistance 100 times or more that of the conductive substrate or a specific resistance of $10^{-2}$ $\Omega$.cm or more; bringing the processing part of the heating member into contact with the object to be processed before, after or simultaneously with the power supply; and processing the object to be processed by heat generated upon the power supply.

BRIEF DESCRIPTION OF THE DRAWINGS

FIG. 1 is a perspective view showing a heating member according to the present invention;

FIG. 2 is a perspective view in which four heating members according to the present invention are arranged in series with each other;

DETAILED DESCRIPTION OF THE PREFERRED EMBODIMENT

Figure 3:
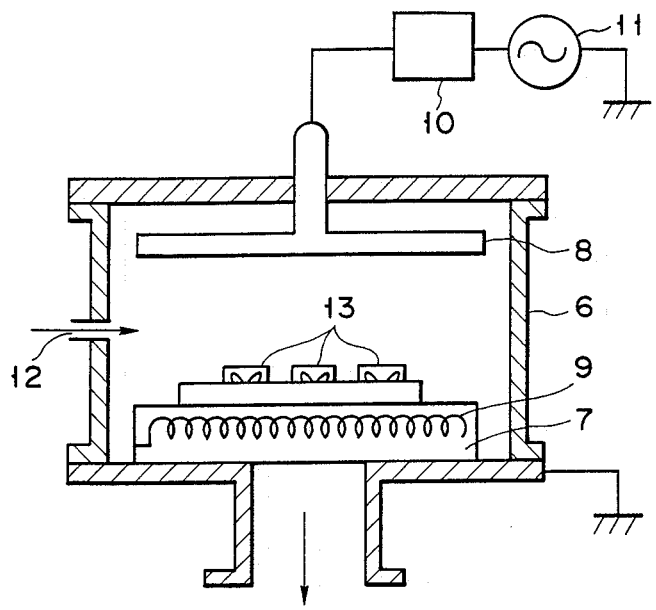
FIG. 3 is a sectional view showing a plasma CVD apparatus for manufacturing the heating member according to the present invention.

A preferred embodiment of the present invention will be described in detail below with reference to the accompanying drawings.

FIG. 1 is a perspective view showing a heating member of the present invention for use in a soldering apparatus.

Referring to FIG. 1, a heating member 13 has a shape as shown in FIG. 1 in order to shorten a time required for increasing or decreasing a temperature upon power supply or heat radiation, respectively. An insulating layer is formed on the surface of the heating member 13 especially on its bottom surface which will be brought into contact with a lead wire of an IC and wiring of a substrate.

In a first embodiment of the present invention, a specific resistance of the insulating layer formed on the surface of a substrate of the heating member 13 is 100 times or more that of the substrate.

The insulating layer may be a region which contains a larger amount of at least one element selected from the group consisting of silicon, carbon, oxygen, nitrogen, germanium, zirconium, yttrium, and Group III and V elements of the Periodic Table than that in the substrate.

Since a temperature is increased/decreased at a period of several seconds in an automatic soldering apparatus, the material of the insulating layer must have high thermal conductivity. Therefore, when the insulating layer is an insulating film having a film thickness exceeding 1 lm, the thermal conductivity must be 1 $Wm^{-1}K^{-1}$ or more. Silicon, germanium and graphite having high thermal conductivities may be employed. In addition, although the thermal conductivity of a nitride or carbide of silicon or germanium is higher in a crystalline state, it is still considerably high in an amorphous state. Also any material containing the above-mentioned elements has high thermal conductivity.

In order to form an insulating layer on the surface or surface region of a substrate, a substrate consisting of a conductive material is heated in a nitrogen, hydrocarbon or oxygen atmosphere up to 500° C. or more to cause the substrate to contain the element. Alternatively, ion implantation, sputtering, ion plating, vacuum deposition, plasma CVD, ECR plasma CVD, thermal CVD or optical CVD may be used.

When ion implantation is used, an insulating layer is formed on a surface region of a substrate although its boundary may be not clear. When any of the remaining methods is used, an insulating film is formed on the surface of a substrate.

When the element contained in the insulating layer is carbon, oxygen or nitrogen, the layer may become weak if the content of the element is increased. In this case, therefore, the content of the element is preferably 0.01 to 20 at %. The content of zirconium, yttrium, gallium, silicon or germanium is preferably 50 at % or less.

Since the heating material has a potential difference of about 1 to 10 V with respect to the ground potential, the insulating layer requires a film thickness not causing insulation breakdown against the voltage.

Therefore, the thickness of the insulating layer is preferably 500 Å, and more preferably 1,000 Å or more. In consideration of the thermal conductivity, an upper limit of the thickness is preferably 5 mm when the insulating layer is an insulating region, and is preferably 5 $\mu$m when it is an insulating film.

In a second embodiment of the present invention, a specific resistance of an insulating layer formed on the surface of a substrate is $10^{-2}$ $\Omega$.cm or more.

More specifically, the material of the insulating layer comprises at least one element selected from the group consisting of silicon, carbon, oxygen, nitride, and germanium, and Group III elements of the Periodic Table. The reason for this is as follows. That is, the insulating layer must consist of a material which is not peeled from the substrate in a heating cycle of about 150° to 300° C. In addition, since the temperature of the heating member is increased/decreased at a period of several seconds in an automatic soldering apparatus, the material of the insulating layer must have high thermal conductivity. Therefore, when the thickness of the insulating layer exceeds 1 $\mu$m, the thermal conductivity must be 1 $wm^{-1}k^{-1}$ or more. Silicon, germanium and graphite have high thermal conductivities. In addition, although the thermal conductivity of a nitride or carbide of silicon or germanium is higher in a crystalline state, it is still considerably high in an amorphous state. Also, any of the above-mentioned materials has high conductivity.

The film thickness of the insulating layer is preferably 500 Å or more, and more preferably 1,000 Å or more. In consideration of an abrasion resistance, the thickness is most preferably about 2 $\mu$m. In consideration of the thermal conductivity, a thickness of 5 $\mu$m or more is not preferable.

The insulating layer is formed on the surface of the substrate by sputtering, ion plating, vacuum deposition, plasma CVD, ECR plasma CVD, thermal CVD, optical CVD or the like. Of these methods, plasma CVD and ECR plasma CVD are most suitable because the adhesion strength of the film is good, the film can be formed at a comparatively low temperature and therefore characteristics of the film are not degraded, and electrical characteristics of the film can be easily controlled.

In the automatic soldering apparatus, four heating members manufactured as described above are arranged to surround four sides of an IC, as shown in FIG. 2. These heating members are electrically connected in series with each other to an AC power source of 50 Hz.

A soldering process using the heating members arranged as shown in FIG. 2 is performed as follows. When an IC placed on a substrate is automatically conveyed, the heating members 13 descend to urge lead wires of the IC with a pressure of about 2 kg/cm². At the same time, a current of about 500 Å is supplied to the heating members 13 to heat them up to about 300° C. After a solder is melted and the lead wires are connected to circuits of the substrate, power supply is stopped, and the heating members 13 then move upward after the solder is solidified. In this manner, one cycle of soldering is completed.

Various examples of manufacturing the heating member according to the present invention by forming an insulating layer on or in the surface of a substrate consisting of a conductive material will be described below.

EXAMPLE 1

In this example, as listed in Table 1, each of eight types of insulating films was formed on a substrate by plasma CVD. FIG. 3 is a schematic view showing a capacitance-coupled plasma CVD apparatus of a parallel plate type used in formation of an insulating film in this example. A plate-like ground electrode 7 and an RF electrode 8 are located in a vacuum chamber 6. A heater 9 is connected to the ground electrode 7. The RF electrode 8 is connected to an RF power source 11 via a matching box 10. A gas inlet port 12 is formed in the chamber 6.

In order to form an insulating film on the conductive heating member 13 by using the above apparatus, the heating members 13 were loaded on the ground electrode 7, and the chamber 6 was evacuated by a vacuum pump (not shown) to about $10^{-3}$ Torr. Each heating member 13 was heated up to about 150° to 450° C. by the heater 9 connected to the ground electrode 7, a source gas such as $SiH_4$, $N_2$, $CH_4$ or the like was supplied to the chamber 6, and the chamber 6 was evacuated to maintain a vacuum degree of 0.05 to 1.0 Torr therein. When power was supplied to the RF electrode 8, a glow discharge was induced between the electrodes 7 and 8, and a plasma of the source gas formed a thin insulating film on the surface of the heating member 13. The types of source gas and film formation conditions are listed in Table 1. For example, a film having an SiCN composition was formed by supplying, as a source gas, 100 SCCM of $SiH_4$, 500 SCCM of $N_2$ and 400 SCCM of $CH_4$ from the gas inlet port 12, and applying a voltage of 500 W to the RF electrode 8 while a reaction pressure in the chamber 6 was maintained at 1.0 Torr.

In this case, a 3.0-μm thick film was formed with a film formation time of 40 minutes.

Insulating films of other compositions were similarly formed, and components, types and flow rates of the source gases, reaction pressures in the chamber, powers to be applied to the RF electrodes 8, film formation times, film thicknesses, and specific resistances for the respective films are as listed in Table 1.

heat is generated mainly at this portion having a high specific resistance, and only a small amount of current is required as a whole. That is, a portion of a substrate in which no ions are implanted serves as a current supply terminal, and its ion-implanted portion serves as a heater. The depth of the portion having a high specific resistance is preferably 1,000 Å to 5 mm.

EXAMPLE 3

In this example, films having components listed in

TABLE 1

| Film Component | SiCN | SiC | SiO | SiN | AlN | BN | BC | BCN |
|---|---|---|---|---|---|---|---|---|
| Source Gas | | | | | | | | |
| Flow Rate (SCCM) | SiH$_4$/100 N$_2$/500 CH$_4$/300 | SiH$_4$/50 CH$_4$/300 | SiH$_4$/50 O$_2$/300 | SiH$_4$/100 N$_2$/800 | Al$_2$/(CH$_3$)$_3$/20 N$_2$/50 | B$_2$H$_6$/20 N$_2$/50 | B$_2$H$_6$/20 CH$_4$/30 | B$_2$H$_6$/20 CH$_4$/20 N$_2$/50 |
| Reaction Pressure (Torr) | 1.0 | 1.0 | 1.0 | 1.0 | 1.0 | 1.0 | 1.0 | 1.0 |
| RF Power (W) | 500 | 500 | 500 | 500 | 800 | 500 | 500 | 500 |
| Film Formation Time (min.) | 40 | 40 | 40 | 40 | 40 | 30 | 30 | 30 |
| Film Thickness (μm) | 3.0 | 3.0 | 3.0 | 3.0 | 3.0 | 3.0 | 3.0 | 3.0 |

| Film Component | Al$_2$O$_3$ | W | C (Diamond) | GeO | Ge | GeN | GeC |
|---|---|---|---|---|---|---|---|
| Source Gas | | | | | | | |
| Flow Rate (SCCM) | Al$_2$/(CH$_3$)$_3$/20 O$_2$/300 | WF$_6$/20 CH$_4$/250 | CH$_4$/30 | GeH$_4$/120 O$_2$/200 | GeH$_4$/100 | GeH$_4$/120 N$_2$/800 | Ge$_4$/120 CH$_4$/300 |
| Reaction Pressure (Torr) | 1.0 | 1.0 | 20 | 1.0 | 1.0 | 1.0 | 1.0 |
| RF Power (W) | 800 | 1000 | 1500 | 500 | 300 | 500 | 800 |
| Film Formation Time (min.) | 60 | 60 | 60 | 40 | 60 | 40 | 60 |
| Film Thickness (μm) | 3.0 | 3.0 | 2.0 | 3.0 | 3.0 | 3.0 | 3.0 |

According to plasma CVD, the heating member can be processed at a comparatively low temperature of 150° to 450° C. Therefore, a film strongly adhered on a substrate can by formed without degrading characteristics of the heating member.

EXAMPLE 2

Figure 4:
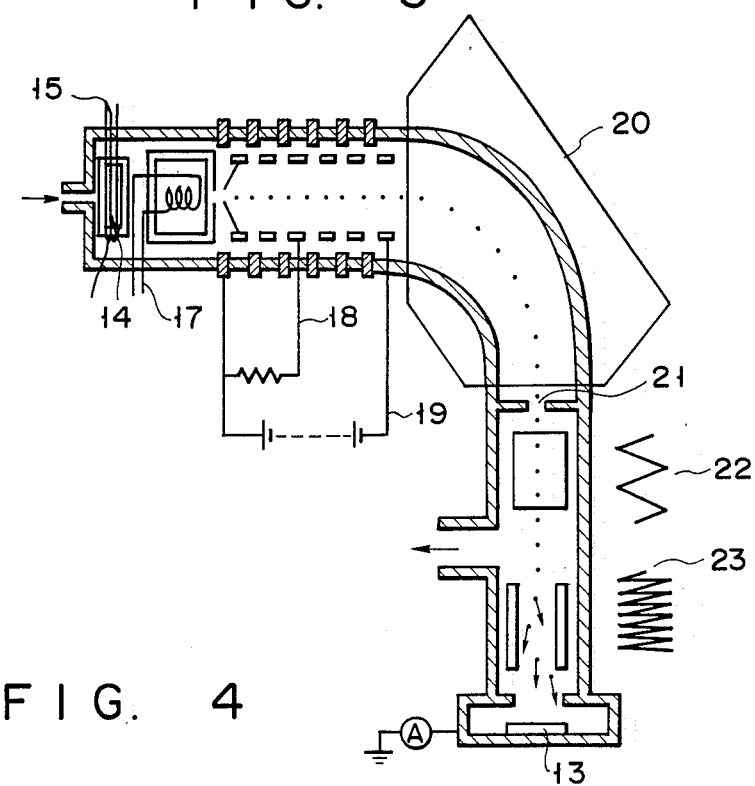
FIG. 4 is a sectional view showing an ion implantation apparatus for manufacturing the heating member according to the present invention.

In this example, a portion having a high specific resistance was formed in the surface region of a substrate by an ion implantation apparatus as shown in FIG. 4. A solid member 14 as a source was placed in an oven 15, and a reaction gas was supplied therein. A current was then flowed through a filament 17 to heat it, so that the reaction gas liberated and ionized elements in the source solid member. The generated ions were focused by a focus 18 and accelerated by an accelerator 19. Subsequently, a magnetic field is applied by a magnet 20 so that only a desired type of ions were extracted from the liberated ions through a slit 21. Electric fields were then applied by Y-and X-scanners 22 and 23. The ions which acquired a high energy by the magnetic and electric fields were radiated on and implanted in a conductive substrate 13.

Examples of the ion to be implanted by ion implantation are nitrogen, carbon, oxygen, phosphorus, boron, indium, yttrium, silicon and germanium. When a large amount of zirconium, yttrium, gallium, silicon or germanium is contained, not only a specific resistance is increased, but also an abrasion resistance is improved. As a result, a power heating member which can be used several ten thousand times can be manufactured.

Figure 5:
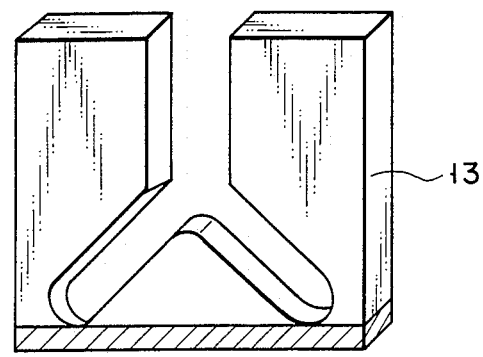
FIG. 5 is a perspective view showing the heating member subjected to ion implantation by the apparatus shown in FIG. 4.
Figure 6:
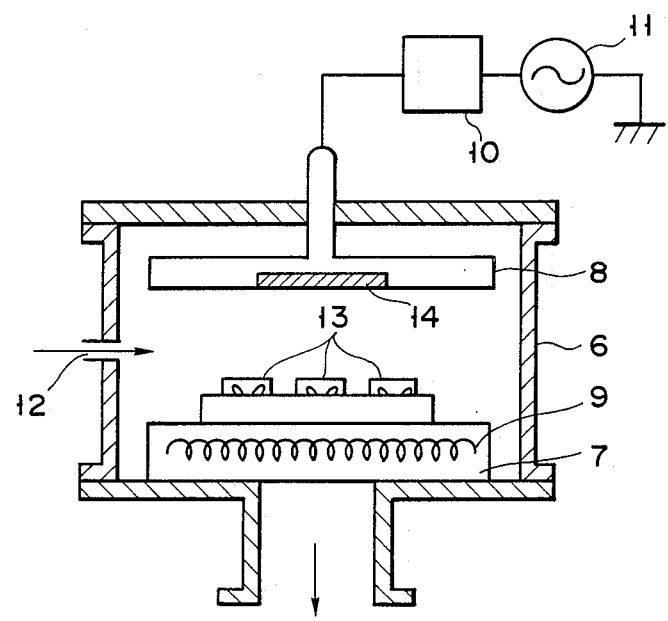
FIG. 6 is a sectional view showing a sputtering apparatus for manufacturing the heating member according to the present invention.

In addition, as shown in FIG. 5, when a portion having a high specific resistance is formed on only a portion (hatched portion) of a heating member to be directly brought into contact with an object to be processed, Table 2 were formed by sputtering. A sputtering apparatus used in this example is shown in FIG. 6. A plate-like ground electrode 7 and an RF electrode 8 are arranged to oppose each other in a vacuum chamber 6, and a heater 9 is connected to the ground electrode 7. The RF electrode 8 is connected to an RF power source 11 via a matching box 10. A gas inlet port 12 is formed in a side wall of the chamber 6. This sputtering apparatus is similar to the plasma CVD apparatus shown in FIG. 3 except that a solid member of a source material is placed as a target 14 in the RF electrode 8. In order to form an insulating film by using this apparatus, a solid member of a source material was placed as the target 14, and an Ar gas, and if necessary, a reaction gas were simultaneously supplied from the gas inlet port 12. After Ar ions in plasmas of these gases liberated the substance of the target 14 in an atomic or molecular state, an insulating film was formed on the surface of a heating member 13 by a reaction in the plasma of the reaction gas. Film components, types of source material, film formation conditions and the like of the formed films are listed in Table 2. For example, a film consisting of amorphous silicon was formed by using monocrystalline or polycrystalline silicon as a target, supplying 10 SCCM of an Ar gas and 100 SCCM of an H$_2$ gas from the gas inlet port 12, and applying a voltage of 500 W to the RF electrode 8 while the pressure in the chamber was maintained at $1 \times 10^{-3}$ Torr. In this case, a 3.0-μm thick amorphous silicon film was formed with a film formation time of 60 minutes. Alternatively, 1 SCCM of a B$_2$H$_6$ gas or PH gas may be supplied as a source gas together with the Ar and H$_2$ gases. Films of other components were similarly formed, and types of solid member used as a target, types and flow rates of source gases, reaction pressures in the chamber 6, powers applied to the RF electrode 8, film formation times, and film thicknesses for the respective films are listed in Table 2.

A film formation method adopting sputtering is advantageous because a solid member which can be easily handled can be used as a source material and the shape of the apparatus need not be changed in accordance with that of the heating member.

(e.g., $N_2$, $O_2$ or $CH_4$) or a gas (Ar, He or $-H_2$) reactive itself but supplying an energy to—another was supplied from the inlet pipe 21 to the plasma formation chamber 16. A 2.45-GHz microwave was supplied to the plasma formation chamber 16 to generate an electric field E. In addition, a current was flowed through the electromagnet 22 to form a 875-G (gauss) magnetic field B in the chamber 16. When electrons in the chamber 16 resonated and were excited, an energy of the electrons was

TABLE 2

| Film Component | Amorphous Silicon | | | Amorphous Germanium | Silicon Carbide | | Silicon Nitride | | $SiO_2$ | TiN |
| --- | --- | --- | --- | --- | --- | --- | --- | --- | --- | --- |
| Target | Monocrystalline or Polycrystalline Silicon | | | Monocrystalline or Polycrystalline Germanium | Sintered Silicon Carbide | | Sintered Silicon Nitride | | $SiO_2$ | TiN |
| Source Gas | | | | | | | | | | |
| Flow Rate (SCCM) | Ar/10 $H_2$/100 | Ar/10 $H_2$/100 $B_2H_6$/1 | Ar/10 $H_2$/100 $PH_3$/1 | Ar/10 $H_2$/100 | Ar/10 | Ar/10 $CH_4$/50 | Ar/10 | Ar/10 $NH_3$/50 | Ar/10 | Ar/10 $N_2$/50 |
| Reaction Pressure (Torr) | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ | $1 \times 10^{-3}$ |
| RF Power (W) | 500 | 500 | 500 | 500 | 500 | 500 | 500 | 500 | 500 | 800 |
| Film Formation Time (min) | 60 | 60 | 60 | 60 | 120 | 120 | 80 | 80 | 80 | 60 |
| Film Thickness (μm) | 3.0 | 3.0 | 3.0 | 3.0 | 3.0 | 3.0 | 3.0 | 3.0 | 3.0 | 3.0 |

| Film Component | AlN | $Al_2O_3$ | BN | GeC | | GeN | | GeO |
| --- | --- | --- | --- | --- | --- | --- | --- | --- |
| Target | Sintered AlN | Sintered $Al_2O_3$ | Crystalline BN | Sintered GeC | Monocrystalline Ge | Sintered GeN | Sintered GeN | $GeO_2$ |
| Source Gas | | | | | | | | |
| Flow Rate (SCCM) | Ar/10 $NH_3$/50 | Ar/10 | Ar/10 | Ar/10 | Ar/10 $CH_4$/50 | Ar/10 | Ar/10 $NH_3$/50 | Ar/10 |
| Reaction Pressure (Torr) | $1.0 \times 10^{-3}$ | $1.0 \times 10^{-3}$ | $1.0 \times 10^{-3}$ | $1.0 \times 10^{-3}$ | $1.0 \times 10^{-3}$ | $1.0 \times 10^{-3}$ | $1.0 \times 10^{-3}$ | $1.0 \times 10^{-3}$ |
| RF Power (W) | 800 | 800 | 800 | 500 | 500 | 500 | 500 | 500 |
| Film Formation Time (min) | 60 | 120 | 60 | 120 | 120 | 80 | 80 | 80 |
| Film Thickness (μm) | 3.0 | 3.0 | 3.0 | 3.0 | 3.0 | 3.0 | 3.0 | 3.0 |

EXAMPLE 4

Figure 7:
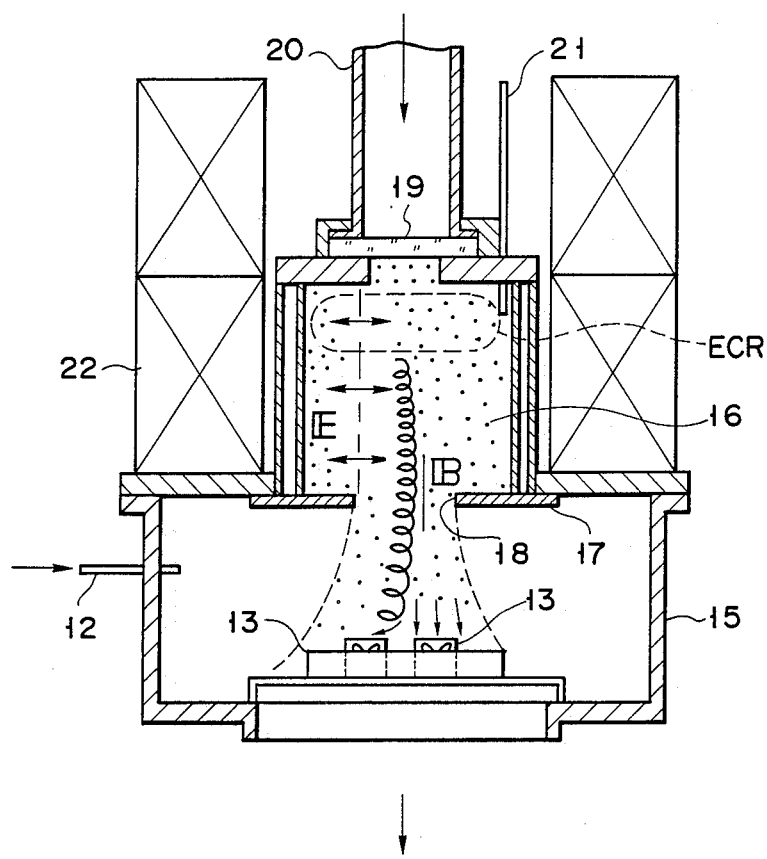
FIG. 7 is a sectional view showing an ECR plasma CVD apparatus for manufacturing the heating member according to the present invention.

In this example, an insulating film was formed by ECR plasma CVD. An apparatus used in this method is as shown in FIG. 7. A gas inlet pipe 12 is formed in a side wall of a film formation chamber 15. A plasma formation chamber 16 is located on the film formation chamber 15. The chambers 15 and 16 communicate with each other via a plasma inlet port 18 formed in a partition 17. A quartz plate 19 is located on the upper wall of the plasma formation chamber 16, and a microwave waveguide 20 is located above the quartz plate 19. A gas inlet pipe 21 is formed in the upper wall of the chamber 16. An electromagnet 22 surrounds the chamber 16.

In order to form an insulating film on a heating member by using the above apparatus, heating members 13 were placed on a bottom portion of the film formation chamber 15, and film formation was performed as follows. The chamber 15 was evacuated by a vacuum pump to maintain a vacuum degree of $1 \times 10^{-4}$ to $5 \times 10^{-3}$. A source gas was supplied from the inlet pipe 12 to the film formation chamber 15, and a reaction gas applied to the $N_2$ or Ar gas supplied from the pipe 21, thereby forming a plasma of the gas. The plasma was extracted from the plasma inlet port 18 to the film formation chamber 15 as the magnetic field diffused. The source gas supplied from the pipe 12 to the chamber 15 was decomposed by the plasma to cause a reaction. In this manner, a film consisting of the component of the reaction gas was formed on the surface of each plate-like heating member 13 placed in the film formation chamber 15. The types of reaction gas, film formation conditions and the like of the individual films are listed in Table 3. For example, a film of an SiN was formed by supplying 10 SCCM of $SiH_4$ as a source gas from the gas inlet pipe and 50 SCCM of an $N_2$ gas was supplied as a reaction gas from the gas inlet pipe. The pressure in the chamber was maintained at $3 \times 10^{-4}$ Torr, and the microwave power was set at 500 W. In this case, a 3.0-μm thick film was formed with a film formation time of 40 minutes. Films of other components were similarly formed, and types and flow rates of the source gases, reaction pressures in the chamber 16, microwave powers, film formation times, film thicknesses, and specific resistances for the respective films are listed in Table 3. As described above, according to ECR plasma CVD, the heating member can be processed without heating it. Therefore, a film having a uniform component can be strongly adhered on the member.

times, and a solder hardly adheres on the heating member.

As has been described above, according to the heating member of the present invention, an insulating layer is formed on a portion to be brought into contact with an object to be processed. Therefore, a shunt current

TABLE 3

| Film Component | SiN | SiC | SiO | TiN | TiC | TiCN | BN | BC | BCN |
|---|---|---|---|---|---|---|---|---|---|
| Source Gas Flow Rate (SCCM) | SiH$_4$/10 | SiH$_4$/10 | SiH$_4$/10 | TiCl$_4$/10 | TiCl$_4$/10 | TiCl$_4$/10 | B$_2$H$_6$/10 | B$_2$H$_6$/10 | B$_2$H$_6$/10 |
| Reaction Gas Flow Rate (SCCM) | N$_2$/50 | CH$_4$/30 | O$_2$/30 | N$_2$/50 H$_2$/200 | CH$_4$/30 H$_2$/200 | CH$_4$/20 N$_2$/50 H$_2$/200 | N$_2$/50 | CH$_4$/30 | CH$_4$/30 N$_2$/50 |
| Reaction Pressure (Torr) | $3 \times 10^{-4}$ | $3 \times 10^{-4}$ | $3 \times 10^{-4}$ | $3 \times 10^{-4}$ | $3 \times 10^{-4}$ | $3 \times 10^{-4}$ | $3 \times 10^{-4}$ | $3 \times 10^{-4}$ | $3 \times 10^{-4}$ |
| Microwave Power (W) | 500 | 500 | 500 | 1000 | 1000 | 1000 | 500 | 500 | 500 |
| Film Formation Time (min) | 40 | 40 | 40 | 60 | 60 | 60 | 30 | 30 | 30 |
| Film Thickness ($\mu$m) | 3.0 | 3.0 | 3.0 | 3.0 | 3.0 | 3.0 | 3.0 | 3.0 | 3.0 |

| Film Component | Al$_2$O$_3$ | AlN | WC |
|---|---|---|---|
| Source Gas Flow Rate (SCCM) | Al(CH$_3$)$_3$/10 | Al(CH$_3$)$_3$/10 | WF$_6$/10 |
| Reaction Gas Flow Rate (SCCM) | O$_2$/30 | N$_2$/30 | CH$_4$/50 |
| Reaction Pressure (Torr) | $3 \times 10^{-4}$ | $3 \times 10^{-4}$ | $3 \times 10^{-4}$ |
| Microwave Power (W) | 800 | 800 | 1000 |
| Film Formation Time (min) | 60 | 60 | 60 |
| Film Thickness ($\mu$m) | 3.0 | 3.0 | 3.0 |

When Ar ion bombardment is performed before the film formation methods in any of Examples 1, 3 and 4, adhesion strength between a film and a substrate can be further increased. In order to perform this processing in plasma CVD or ECR plasma CVD, Ar is flowed to form a plasma without supplying a source gas for forming a film. In sputtering, this processing is performed by applying a power not to a target but to a substrate.

In order to increase the adhesion strength between a film and a substrate in any of Examples 1, 3 and 4, a region containing a larger amount of nitrogen, carbon, oxygen or the like than that in the substrate may be formed in an interface between the film and the substrate. For this purpose, an insulating film may be formed on a substrate which is subjected to ion nitriding or carburizing beforehand, or a gas of N$_2$, O$_2$, CH$_4$ or the like may be mixed in an Ar gas upon ion bombardment. Alternatively, ion bombardment of a gas of N$_2$, O$_2$, CH$_4$ or the like may be performed.

The insulating layer formed in any of the above examples has many advantages. For example, the insulating layer has high abrasion and oxidation resistances and therefore can be used even several ten thousand does not flow from the heating member to the object to be processed, thereby solving problems of, e.g., disconnection of wiring.

What is claimed is:

1. A heating member for processing an object in contact therewith by heat generated upon application of an electric current thereto, comprising:
   a conductive heating substrate through which an electric current flows; and
   an insulating layer formed at least at that portion of said substrate which is brought into contact with said object to be processed and having a specific resistance not less than 100 times that of said conductive substrate.

2. A heating member according to claim 1, wherein said insulating layer contains a larger amount of at least one element selected from the group consisting of silicon, carbon, oxygen, nitrogen, germanium, zirconium, yttrium, Group III element, and Group V element than that contained in said substrate.

3. A heating member according to claim 2, wherein said element is at least one member selected from the group consisting of carbon and oxygen, the content of said element in said insulating layer being 0.01 to 20 atomic %.

4. A heating member according to claim 2, wherein said element is at least one member selected from the group consisting of zirconium, yttrium, gallium, silicon and germanium, the content of said element in said insulating layer being 0.01 to 50 atomic %.

5. A heating member according to claim 1, wherein said insulating layer is formed by a method selected from the group consisting of a heat treatment, ion implantation, sputtering, ion plating, vacuum deposition, plasma CVD, ECR plasma CVD, thermal CVD and optical CVD.

6. A heating member according to claim 5, wherein said insulating layer has a thickness of 500 Å to 5 μm.

7. A heating member according to claim 1, wherein said insulting layer is formed by ion implantation.

8. A heating member for processing an object in contact therewith by heat generated upon application of an electric current thereto, comprising:
   a conductive heating substrate through which said electric current flows; and
   an insulating layer formed at least at that portion of said substrate which is brought into contact with said object and having a specific resistance of $10^{-2}$ $\Omega$.cm or more.

9. A heating member according to claim 8, wherein said insulating layer contains at least one element selected from the group consisting of silicon, carbon, oxygen, nitrogen, germanium, and Group III element of the Periodic Table.

10. A heating member according to claim 8, wherein said insulating layer is formed by a method selected from the group consisting of a sputtering, ion plating, vacuum deposition, plasma CVD, ECR plasma CVD, thermal CVD and optical CVD.

11. A heating member according to claim 8, wherein said insulating layer has a thickness of 500 Å to 5 mm.

12. A method of processing an object, comprising the steps of:
   supplying an electric current to a conductive heating substrate of a heating member comprising the heating substrate, and a processing part consisting of an insulating layer formed at least at a portion of the heating substrate and having a specific resistance 100 times or more that of the heating substrate or a specific resistance of $10^{-2}$ .cm or more;
   bringing the process part of the heating member into contact with the object before, after or simultaneously with the application of said electric current; and
   processing the object by heat generated upon application of said electric current.

13. A heating member for processing an object in contact therewith by heat generated upon application of an electric current thereto comprising:
   a conductive heating substrate through which said electric current flows; and
   an insulating layer formed at least at that portion of said substrate which is brought into contact with said object, and having a thickness of 500 Å to 5 mm and a specific resistance not less than 100 times that of said heating substrate.

14. A method of producing a heating member for processing an object in contact therewith by heat generated upon application of an electric current thereto, said method comprising the steps of:
   a. forming a conductive substrate through which an electric current can flow; and
   b. forming an insulating layer having a specific resistance not less than 100 times that of said conductive substrate, on at least that portion of said conductive substrate which is to be brought in contact with said object, wherein said step of forming an insulating layer is performed by a method selected from the group consisting of a heat treatment, ion implantation, sputtering, ion plating, vacuum deposition, plasma CVD, ECR plasma CVD, thermal CVD, and optical CVD.

15. The method of claim 14, wherein said step of forming an insulating layer comprises forming said insulating layer to a thickness of 500 Å to 5μm.

* * * * *

UNITED STATES PATENT AND TRADEMARK OFFICE
CERTIFICATE OF CORRECTION

PATENT NO. : 4,967,058
DATED : October 30, 1990
INVENTOR(S) : Mutsuki YAMAZAKI It is certified that error appears in the above-identified patent and that said Letters Patent is hereby corrected as shown below:

On the title page:
In the heading: please correct the inventor's name as follows:

[75] delete "Mitsuki YAMAZAKI" and insert

--Mutsuki YAMAZAKI--.

Signed and Sealed this

Fifth Day of January, 1993

*Attest:*

DOUGLAS B. COMER

*Attesting Officer*   *Acting Commissioner of Patents and Trademarks*